United States Patent
Lin et al.

(10) Patent No.: US 10,115,675 B2
(45) Date of Patent: Oct. 30, 2018

(54) PACKAGED SEMICONDUCTOR DEVICE AND METHOD OF FABRICATING A PACKAGED SEMICONDUCTOR DEVICE

(71) Applicant: Taiwan Semiconductor Manufacturing Co., Ltd., Hsinchu (TW)

(72) Inventors: Jing-Cheng Lin, Hsinchu (TW); Li-Hui Cheng, New Taipei (TW); Po-Hao Tsai, Taoyuan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/235,114

(22) Filed: Aug. 12, 2016

(65) Prior Publication Data

US 2017/0373016 A1 Dec. 28, 2017

Related U.S. Application Data

(60) Provisional application No. 62/355,335, filed on Jun. 28, 2016.

(51) Int. Cl.
*H01L 23/552* (2006.01)
*H01L 21/56* (2006.01)
*H01L 21/78* (2006.01)
*H01L 23/31* (2006.01)
*H01L 23/48* (2006.01)
(Continued)

(52) U.S. Cl.
CPC .......... *H01L 23/552* (2013.01); *H01L 21/565* (2013.01); *H01L 21/78* (2013.01); *H01L 23/3142* (2013.01); *H01L 23/481* (2013.01); *H01L 24/11* (2013.01); *H01L 24/14* (2013.01); *H01L 25/0655* (2013.01); *H01L 2021/60022* (2013.01); *H01L 2224/1412* (2013.01); *H01L 2224/14104* (2013.01); *H01L 2225/06537* (2013.01); *H01L 2924/3025* (2013.01)

(58) Field of Classification Search
CPC ......... H01L 23/552; H01L 2225/06537; H01L 2924/3025; H01L 24/10–24/17; H01L 2021/60022; H01L 25/0652
See application file for complete search history.

(56) References Cited

U.S. PATENT DOCUMENTS 7,564,115 B2 7/2009 Chen et al.
7,633,165 B2 12/2009 Hsu et al.
(Continued)

*Primary Examiner* — Jose R Diaz
(74) *Attorney, Agent, or Firm* — JCIPRNET

(57) ABSTRACT

In accordance with some embodiments of the present disclosure, a packaged semiconductor device includes a first package structure, at least one outer conductive bump, a second package structure, a sealing material, and an electromagnetic interference (EMI) shielding layer. The first package structure has a first cut edge. The outer conductive bump is disposed on the first package structure and has a second cut edge. The second package structure is jointed onto the first package structure. The sealing material is disposed on the first package structure, surrounds the second package structure, and covers the outer conductive bump. The sealing material has a third cut edge. The EMI shielding layer contacts the first cut edge, the second cut edge and the third cut edge. The EMI shielding layer is electrically connected with the outer conductive bump.

19 Claims, 9 Drawing Sheets

(51) Int. Cl.
*H01L 23/00* (2006.01)
*H01L 25/065* (2006.01)
*H01L 21/60* (2006.01)

(56) References Cited

U.S. PATENT DOCUMENTS

| | | |
|---|---|---|
| 7,825,024 B2 | 11/2010 | Lin et al. |
| 7,973,413 B2 | 7/2011 | Kuo et al. |
| 8,105,875 B1 | 1/2012 | Hu et al. |
| 8,158,456 B2 | 4/2012 | Chen et al. |
| 8,183,578 B2 | 5/2012 | Wang |
| 8,183,579 B2 | 5/2012 | Wang |
| 8,227,902 B2 | 7/2012 | Kuo |
| 8,278,152 B2 | 10/2012 | Liu et al. |
| 8,426,961 B2 | 4/2013 | Shih et al. |
| 8,669,174 B2 | 3/2014 | Wu et al. |
| 8,766,429 B2 * | 7/2014 | Kim ................... H01L 23/552 257/659 |
| 8,802,504 B1 | 8/2014 | Hou et al. |
| 8,803,292 B2 | 8/2014 | Chen et al. |
| 8,803,316 B2 | 8/2014 | Lin et al. |
| 9,070,677 B2 * | 6/2015 | Park ................... H01L 23/49811 |
| 2014/0001645 A1 | 1/2014 | Lin et al. |
| 2014/0124955 A1 * | 5/2014 | Chen ................... H01L 23/3128 257/777 |
| 2014/0225258 A1 | 8/2014 | Chiu et al. |
| 2014/0252572 A1 | 9/2014 | Hou et al. |
| 2015/0287697 A1 | 10/2015 | Tsai et al. |
| 2015/0348872 A1 | 12/2015 | Kuo et al. |

* cited by examiner

PACKAGED SEMICONDUCTOR DEVICE AND METHOD OF FABRICATING A PACKAGED SEMICONDUCTOR DEVICE

CROSS-REFERENCE TO RELATED APPLICATION

This application claims the priority benefit of U.S. provisional application Ser. No. 62/355,335, filed on Jun. 28, 2016. The entirety of the above-mentioned patent application is hereby incorporated by reference herein and made a part of this specification.

BACKGROUND

Packaging technologies for integrated circuits involve encapsulating an integrated circuit (IC) die in encapsulation material and building the required redistribution layer. Package-on-package ("PoP") technology has become increasingly popular as the demand for lower cost, higher performance, increased integrated circuit density, and increased package density continues in the semiconductor industry. For fabricating smaller and smaller packages, the integration of IC die and package (e.g., "pre-stacking" or the integration of system on a chip ("SoC") technology with memory technology) allows for thinner packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
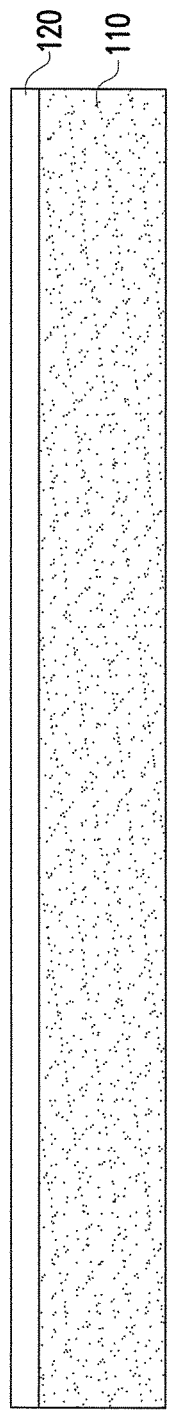
FIG. 1 schematically illustrates a step of forming a polymer buffer layer according to a method of fabricating a packaged semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one component or feature's relationship to another component(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring to FIG. 1, a carrier 110 is provided and a polymer buffer layer 120 is formed thereon. In some embodiments, the carrier 110 may be a substrate with sufficient rigidity or stiffness for providing a solid stand for the subsequent process. The carrier 110 may be, but not limited to a glass substrate. In some embodiments, the carrier 110 is removed from the device formed thereon so as to finish the final device and thus a temporary adhesive layer not shown may be formed on the carrier 110 for connecting the polymer buffer layer 120 and the carrier 110 during fabrication. The temporary adhesive layer may be made of glue material or formed by a plurality of layers including at least one glue layer and at least one polymer layer.

Figure 2:
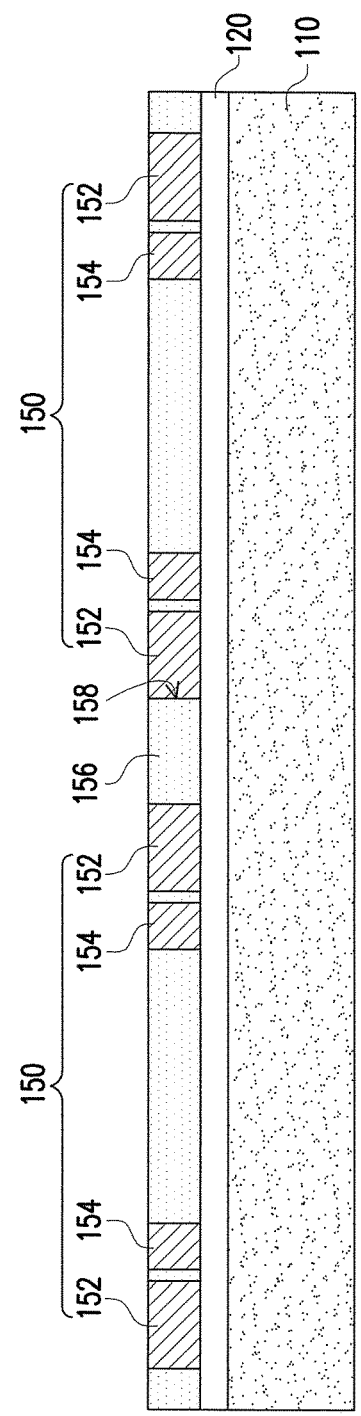
FIGS. 2 and 3 schematically illustrate steps of forming vias according to a method of fabricating a packaged semiconductor device in accordance with some embodiments.

In some embodiments, a seed metal layer not shown may be formed on the polymer buffer layer 120. The method of forming the seed metal layer includes chemical vapor deposition (CVD), physical vapor deposition (PVD), atomic layer deposition (ALD), high density plasma CVD (HDP-CVD), other suitable methods, and/or combinations thereof. Subsequently, as shown in FIG. 2, a plurality of conductive via sets 150 is formed on the polymer buffer layer 120. In some embodiments, the seed metal layer may be omitted and the conductive via sets 150 may be formed on the polymer buffer layer 120 without a seed metal layer interposed between the polymer buffer layer 120 and the conductive via sets 150.

In some embodiments, each of the conductive via set 150 may include at least one outer via 152 and at least one inner via 154. Taken the structure shown in FIG. 2 as an example, when two conductive via sets 150 are arranged next to each other, the outer via 152 of one conductive via set 150, compared to the inner via 154 of the same conductive via set 150, is closer in disposition location to the outer via 152 of an adjacent conductive via set 150.

In some embodiments, the outer vias 152 and the inner vias 154 may be formed by the following exemplary steps, but not limited thereto. A pattern layer 156 is formed on the polymer buffer layer 120 and the pattern layer 156 has a plurality of openings 158 corresponding to respective predetermined locations. In some embodiments, the material of the pattern layer 156 may be photo resist material, photo sensitive material, or the like and the pattern layer 156 is formed by a photolithography process so that the pattern layer 156 has the openings 158. Thereafter, the openings 158 of the pattern layer 156 may be filled with a conductive material so that the outer vias 152 and the inner vias 154 may be formed. The conductive material includes, for example, titanium, tungsten, aluminum, copper, metal alloys, metal silicide, other suitable materials, and/or combinations thereof. In addition, the method of filling the conductive material into the openings 158 includes chemical vapor deposition (CVD), physical vapor deposition (PVD), atomic layer deposition (ALD), high density plasma CVD (HDP-CVD), plating, other suitable methods, and/or combinations thereof. In some embodiments, a seed metal layer between the polymer buffer layer 120 and the pattern layer 156 may be, but not limited to, used for plating. In some embodiments, the material of the seed layer may include Ti, Cu or a combination of the same.

Figure 3:
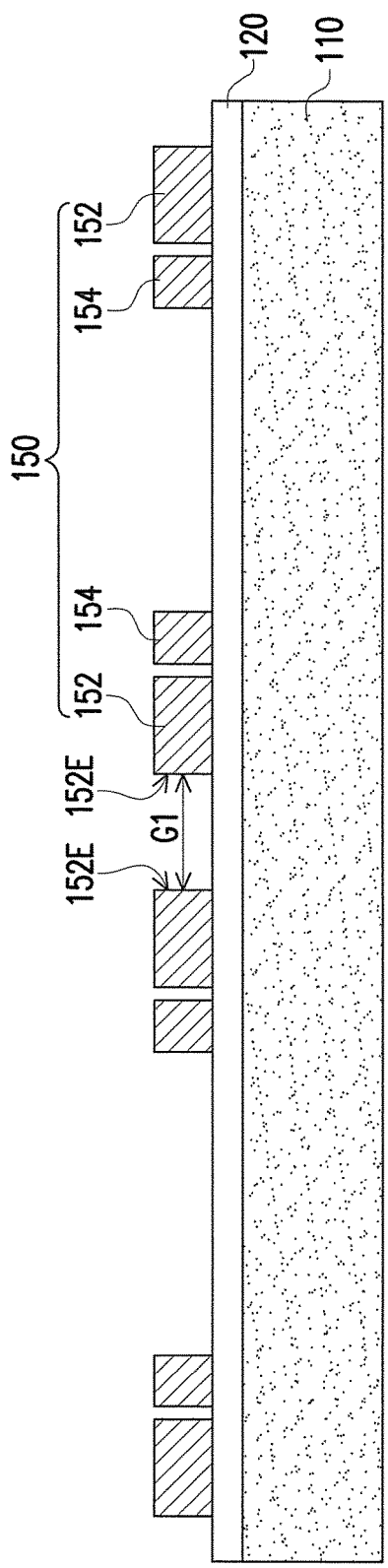

Next, the pattern layer 156 is removed as shown in FIG. 3 and the outer vias 152 and the inner vias 154 are spaced apart from each other after the pattern layer 156 is removed. In some embodiments, the method of removing the pattern layer 156 may include a strip process or an etching process. The outer via 152 of one conductive via set 150 may be spaced apart from the outer via 152 of an adjacent conductive via set 150 by a distance G1. In other words, the distance G1 is formed between an outer edge 152E of the outer via 152 of one conductive via set 150 and an outer edge 152E of the outer via 152 of an adjacent conductive via set 150. The outer vias 152 and the inner vias 154 may have sufficient height H to provide a vertical electrical conduction path.

Figure 4:
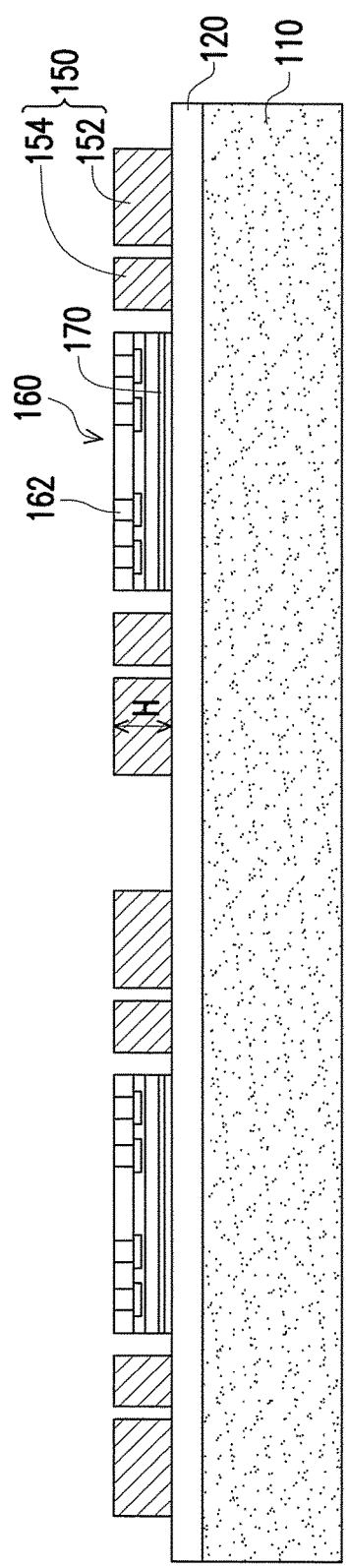
FIG. 4 schematically illustrates a step of die bonding according to a method of fabricating a packaged semiconductor device in accordance with some embodiments.

Referring to FIG. 4, a plurality of dies 160 is placed and attached onto the polymer buffer layer 120 using a die attach film. A die attach adhesive 170 may be used on the backsides of the dies 160 in some embodiments. Each of the dies 160 has a plurality of conductive bond pads 162 that are now facing upwards as oriented in this illustrative example. In one embodiment, the conductive bond pads 162 of the dies 160 may include Cu post or pillar bumps. The dies 160 may respectively be any integrated circuit and may be a memory or an application processor ("AP") such as a microprocessor, a digital signal processor, a general purpose processor, or an application specific integrated circuit ("ASIC"), for example. A height H of the respective outer and inner vias 152 and 154 may be sufficient so that the top of the outer and inner vias 152 and 154 exceeds or equals to the elevation of the top of the die 160 in some embodiments.

Figure 5:
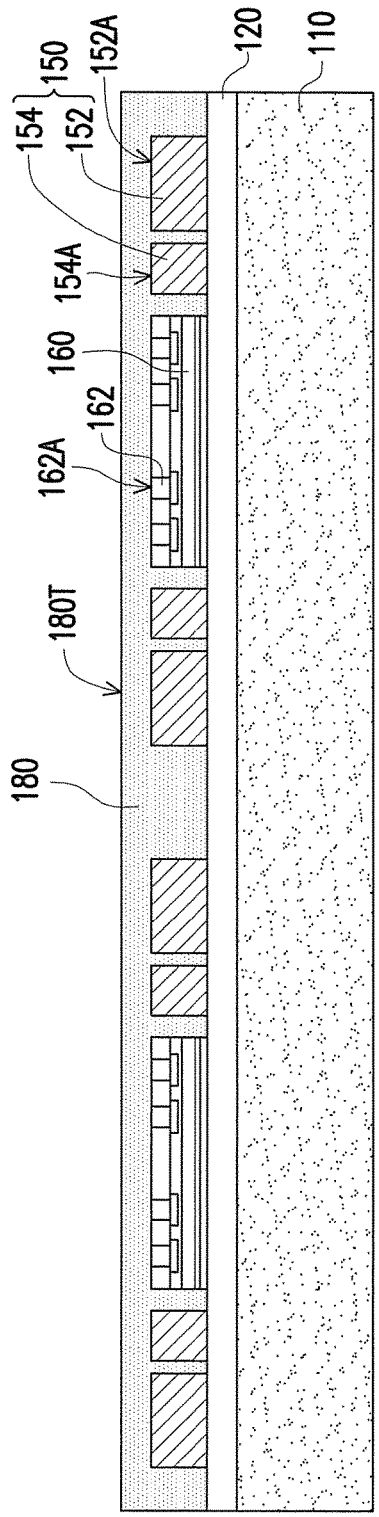
FIG. 5 schematically illustrates a step of forming a package structure according to a method of fabricating a packaged semiconductor device in accordance with some embodiments.

Subsequent to attaching the dies 160 onto the polymer buffer layer 120, a molding compound 180 is formed to encapsulate the dies 160 and the conductive via sets 150 as shown in FIG. 5. The mold compound 180 fills the spaces between the outer vias 152 and the inner vias 154, between the inner vias, between the outer vias 152 of two adjacent conductive via set 150, and between the inner vias 154 and the dies 160. In some embodiments, the molding compound 180 integrally seals and encapsulates the dies 160 and the conductive via sets 150. A material of the molding compound 180 may be a resin capable of being cured through a thermal cure process or UV cure process.

Following the encapsulating process, a grinding process may be applied to the top 180T of the molding compound 180. The grinding process removes at least a portion of the molding compound 180. In some embodiments, the grinding process continues until at least a portion of the upper surfaces 152A of the outer vias 152 and a portion of the upper surfaces 154A of the inner vias 154 and the upper surfaces 162A of the conductive bond pads 162 are exposed. In some embodiments, the grinding process may include a Chemical-Mechanical Planarization (CMP), a polishing process or the like.

Figure 6:
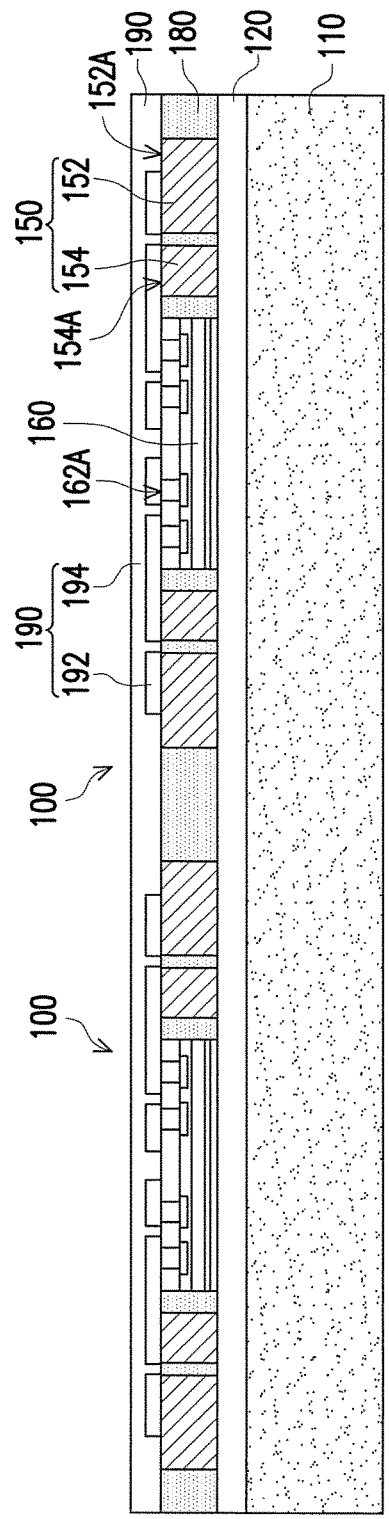
FIG. 6 schematically illustrates a step of forming a redistribution layer on a package structure according to a method of fabricating a packaged semiconductor device in accordance with some embodiments.

Next, referring to FIG. 6, a redistribution layer 190 may be formed over the ground surface of the molding compound 180. The redistribution layer 190 may include at least one conductor such as copper trace distributed in at least one layer of dielectric material. In an example, the traces 192 are formed in the insulation layer 194 and the traces 192 in the redistribution layer 190 may be connected to the upper surfaces 152A of the outer vias 152, the upper surfaces 154A of the inner vias 154 and the upper surfaces 162A of the conductive bond pads 162. In addition, the traces 192 may provide a predetermined layout for mapping the electrical conduction paths of the dies 160 and the conductive via sets 150.

As shown in FIG. 6, a plurality of first package structures 100 is now formed on the carrier 110 and the first package structures 100 are encapsulated by using the same molding compound, e.g. the molding compound 180. One of the first package structures 100 may include the die 160, the conductive via set 150, the molding compound 180, and the redistribution layer 190. The die 160 and the conductive via set 150 are encapsulated and surrounded by the molding compound 180. In addition, the outer vias 152 and the inner vias 154 may penetrate through the molding compound 180 and the conductive via set 150 may electrically connect a portion of the redistribution layer 190 with the following stacked dies or devices. In other words, the conductive via set 150 may provide vertical electric transmission path so that the redistribution layer 190 may be electrically connected with another device such as a die or other components located at the opposite side of the molding compound 180.

In some embodiments, the surface of the redistribution layer 190 may receive a solder bump or other electrical connection. For example, referring to FIG. 7, a plurality of bottom conductive bumps 200 is formed on the redistribution layer 190 and the bottom conductive bumps 200 may be respectively electrically connected with the traces 192 of the redistribution layer 190. The bottom conductive bumps 200 may be controlled collapsing chip connectors ("C4"), solder bumps, or other connectors for connecting to an external device. Furthermore, since the bottom conductive bumps 200 are electrically connected with the redistribution layer 190, at least a portion of the bottom conductive bumps 200 may be electrically connected with another device such as a die or other components subsequently disposed at the opposite side of the molding compound 180 through the redistribution layer 190 and the conductive via set 150.

Figure 7:
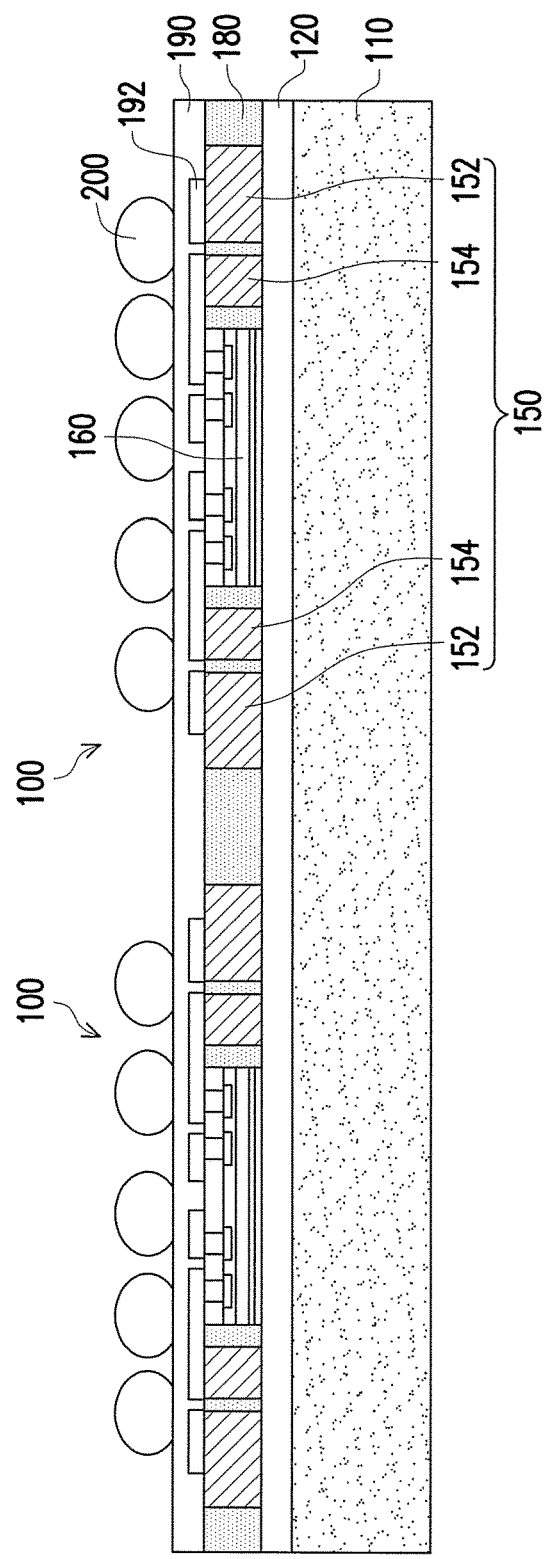
FIG. 7 schematically illustrates a step of forming conductive bumps according to a method of fabricating a packaged semiconductor device in accordance with some embodiments.
Figure 8:
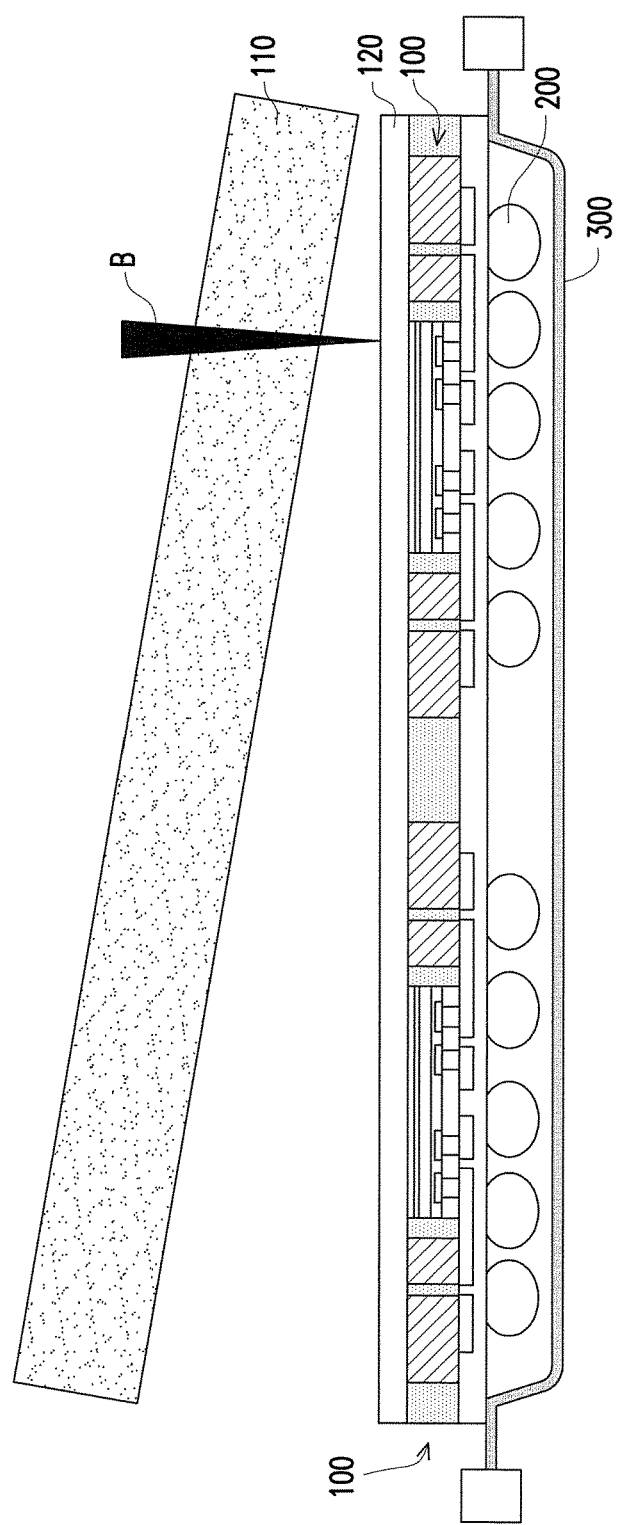
FIGS. 8 and 9 schematically illustrate steps of removing a carrier according to a method of fabricating a packaged semiconductor device in accordance with some embodiments.

Thereafter, referring to FIG. 8, the structure as shown in FIG. 7 is illustrated in an upside down manner. In the step shown in FIG. 8, the first package structures 100 encapsulated together by the same molding compound 180 are attached to a carrier film 300 with the carrier film 300 covering the bottom conductive bumps 200. A debonding process is performed to remove the carrier 110 from the first package structures 100. In an embodiment, the debonding process may include applying an energy beam B to the temporary adhesive layer (not shown) from the carrier 110. In some embodiments, the energy beam B may be a laser beam with sufficient energy to deteriorate the adhesive property of the temporary adhesive layer. In alternative embodiments, the energy beam B may provide sufficient energy to burn the temporary adhesive layer. In the process of removing the carrier 110, the carrier film 300 covering the bottom conductive bumps 200 may support the first package structures 100 and protect the bottom conductive bumps 200 from being damaged or disengaged in the subsequent process. In addition, the energy beam B may be a spot beam, a linear beam, etc and the so called beam is not limited to form a specific irradiation area.

Figure 9:
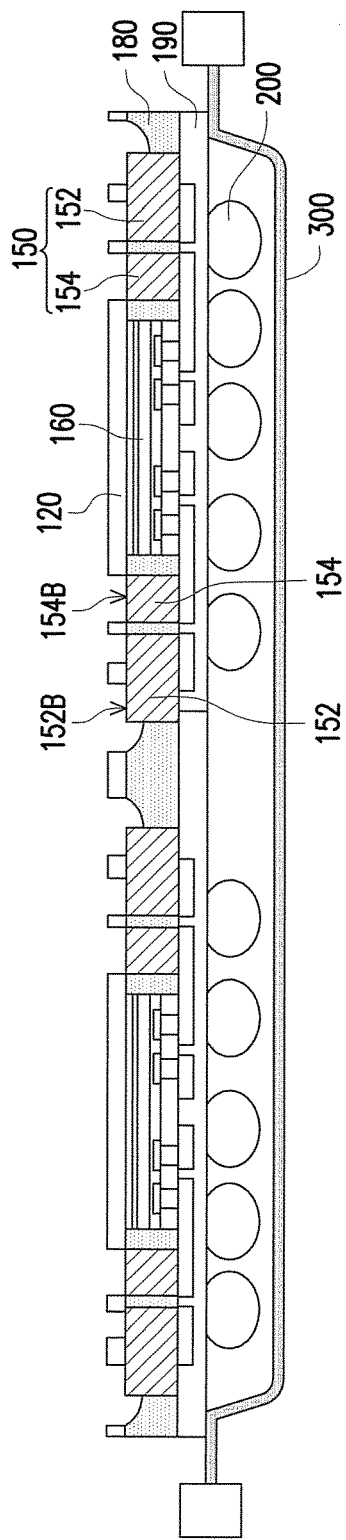

Referring to FIG. 9, a back side pad opening process may be performed after removing the carrier 110. The back side pad opening process may be performed to remove at least a portion of the polymer buffer layer 120 to expose the outer vias 152 and the inner vias 154 by a laser drill, a dry/wet clean, or the like. In some embodiments, the back side pad opening process continuous until exposing the outer vias 152 and the inner vias 154. Thereafter, a solder paste formation process may be performed.

The exposed surfaces 152B and 154B of the outer vias 152 and the inner vias 154 may receive solder bumps or other electrical connection. For example, referring to FIG. 10, a plurality of conductive bumps 400 is formed on the outer vias 152 and the inner vias 154 and respectively electrically connected with the outer vias 152 and the inner vias 154. The conductive bumps 400 may be controlled collapsing chip connectors ("C4"), solder bumps, or other connectors for connecting to an external device. According to the disposition locations, the conductive bumps 400 may include a plurality of outer conductive bumps 410 and a plurality of inner conductive bumps 420. The outer conductive bumps 410 are electrically connected with the outer vias 152. In addition, one outer via 152 may be electrically connected with one outer conductive bump 410 and one inner conductive bump 420.

In some embodiments, the outer conductive bumps 410 electrically connected with one first package structure 100, compared to the inner conductive bumps 420 electrically connected with the same first package structure 100, are closer to the outer conductive bumps 410 electrically connected with an adjacent first package structure 100. The outer conductive bumps 410 may be disposed on the outer via 152 in a manner that a portion of the outer conductive bump 410 exceeds the outer edge 152E of the outer via 152 electrically connected thereto. In other words, a distance G2 between the outer conductive bump 410 of one first package structure 100 and the outer conductive bump 410 of an adjacent first package structure 100 may be smaller than the distance G1 between the outer via 152 of the first package structure 100 and the outer via 152 of the adjacent first package structure 100.

Figure 10:
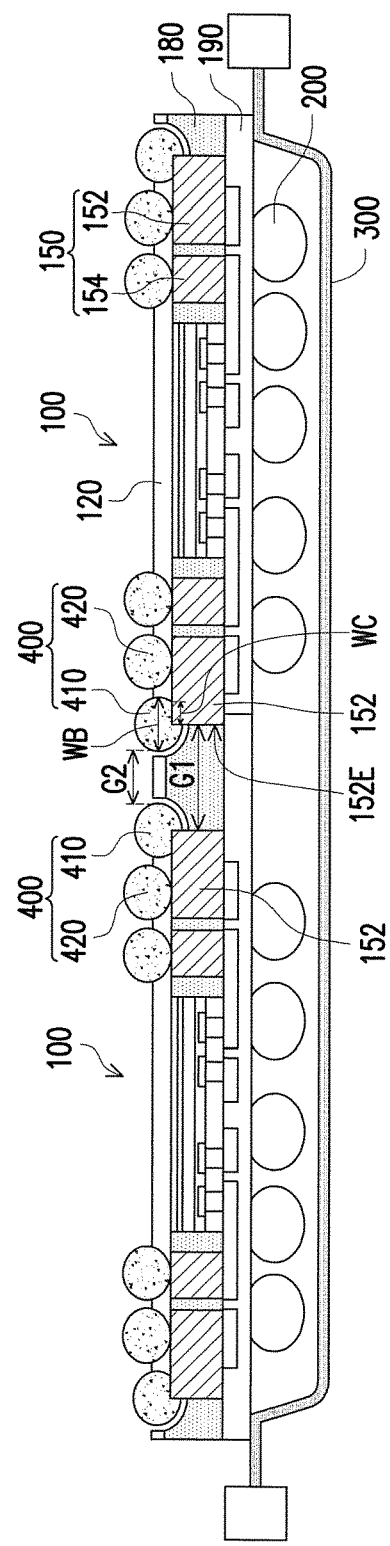
FIG. 10 schematically illustrates a step of forming conductive bumps according to a method of fabricating a packaged semiconductor device in accordance with some embodiments.

As shown in FIG. 10, the outer conductive bump 410 contacts the corresponding outer via 152 around the outer edge 152E and the contact area of the outer conductive bump 410 contacting the corresponding outer via 152 may occupy a part of the top surface of the outer via 152. The outer conductive bump 410 may have a width WB greater than the contact width WC of the outer conductive bump 410 contacting the upper surface 152A of the outer via 152. In some embodiments, the contact width WC of the outer conductive bump 410 contacting the outer via 152 may be 5 μm to 50 μm or may be 20 μm.

Figure 11:
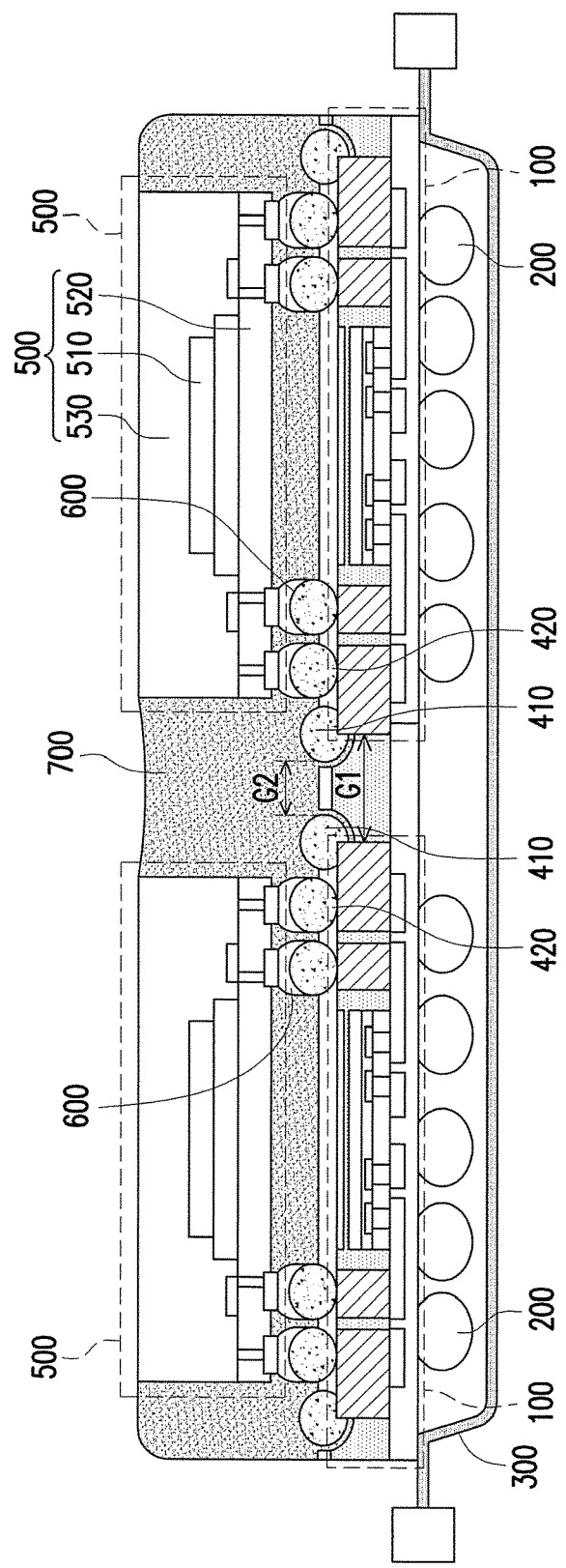
FIG. 11 schematically illustrates a step of bonding a package structure on a package structure according to a method of fabricating a packaged semiconductor device in accordance with some embodiments.

Referring to FIG. 11, a plurality of second package structures 500 may be jointed onto the first package structures 100, respectively and a sealing material 700 is foil led to encapsulate the second package structures 500. In some embodiments, the second package structures 500 may be jointed to the first package structure 100 through the conductive bumps 600. The conductive bumps 600 may be placed onto and bonded to the inner conductive bumps 420 formed on the outer via 152 and the inner vias 154. In other words, the second package structure 500 may be jointed to the first package structures 100 in a flip chip manner. The second package structures 500 may be memory devices jointed to the first package structures 100 by using the flip chip technique. In some embodiment, the memory devices may include dynamic random access memories (DRAM), but not limited thereto.

In some embodiments, one of the second package structures 500 may include at least one die 510, a redistribution layer 520 and a molding compound 530. The dies 510 may be disposed on and electrically connected with the redistribution layer 520. The molding compound 530 may encapsulate the die 510 above the redistribution layer 520. In addition, the conductive bumps 600 may be disposed at the bottom of the second package structure 500 where the redistribution layer 520 is exposed. In some embodiments, the second package structure 500 may not cover over the outer conductive bumps 410 so that the outer conductive bumps 410 are exposed after the second package structures 500 are jointed onto the first package structures 100. The sealing material 700 may be formed to fill the space between the first package structures 100 and the second package structures 500, cover the outer conductive bumps 410, and surround the second package structures 500. In some embodiment, the sealing material 700 may have a taper or concaved profile at the periphery of the second package structures 500 and serve as an underfill fillet. In alternative embodiments, the top surface of the sealing material 700 may be lower than the top surface of the second package structures 500.

Figure 12:
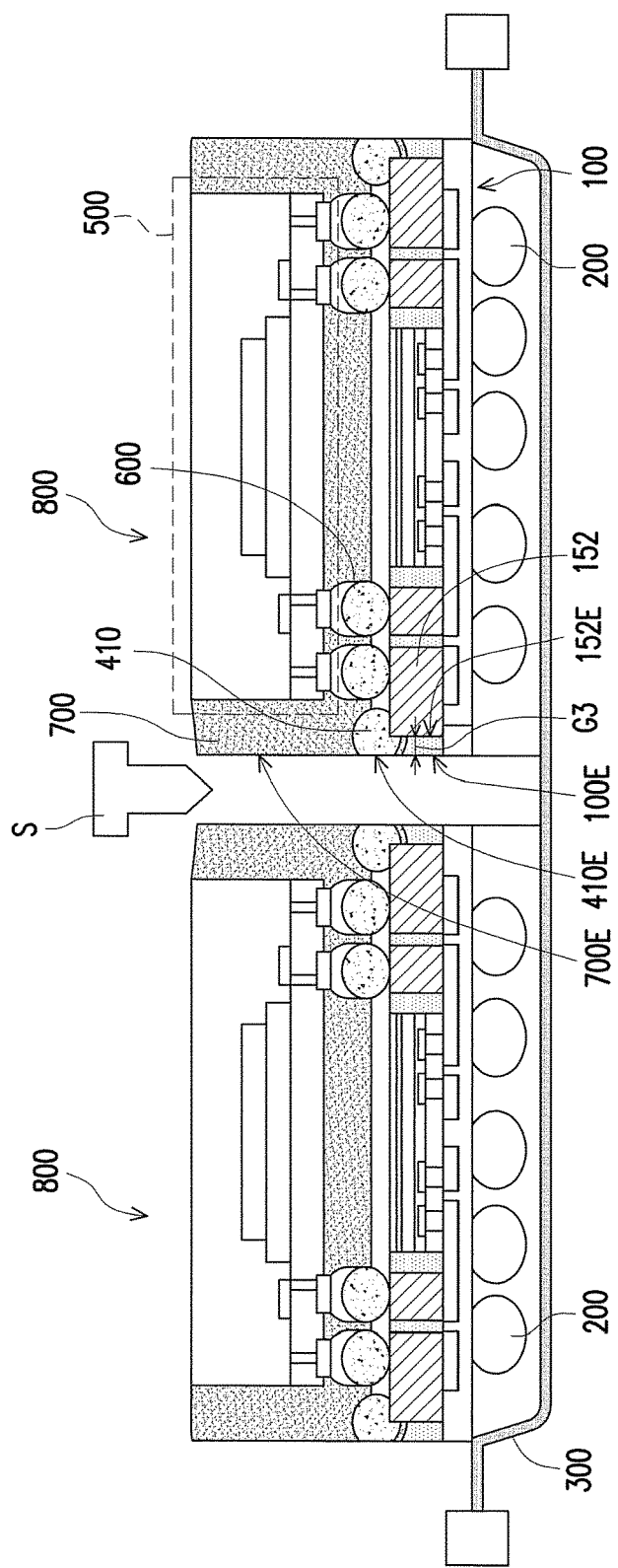
FIG. 12 schematically illustrates a step of singulation process according to a method of fabricating a packaged semiconductor device in accordance with some embodiments.

Referring to FIG. 11 and FIG. 12 together, a singulation process S is performed to form a plurality of package-on-package (POP) devices 800. The singulation process S is performed by cutting the structure shown in FIG. 11 along a cutting trajectory. The cutting trajectory may be controlled to be extended along the distance G2 and the cutting trajectory may not exceed the distance G1. In some embodiment, the first package structure 100 may have a first cut edge 100E, the outer conductive bump 410 may have a second cut edge 410E, and the sealing material 700 may have a third cut edge 700E after the singulation process so that the outer conductive bumps 410 are exposed as shown in FIG. 12. In addition, the outer edge 152E of the outer via 152 may not be exposed at the first cut edge 100E of the first package structure 100 and remain surrounded by the molding compound 180. In other words, the first cut edge 100E is an exposed portion of the molding compound 180 of the first package structure 100.

In some embodiment, a distance G3 may exist between the outer edge 152E of the outer via 152 and the first cut edge 100E and the molding compound 180 fills where the distance G3 exists. During the singulation process, the outer via 152 may not be cut and remain covered by the molding compound 180, which prevents the metal smear effect of cutting the outer via 152. In the case that the outer via 152 is cut during the singulation process, the first cut edge 100E may not be flat and smooth due to the smear effect of the outer via 152. Therefore, the singulation process performed while remaining the molding compound 180 covering and surrounding the outer via 152 helps to improve the yield rate and improve the flatness of the first cut edge 100E of the first package structure 100.

Figure 13:
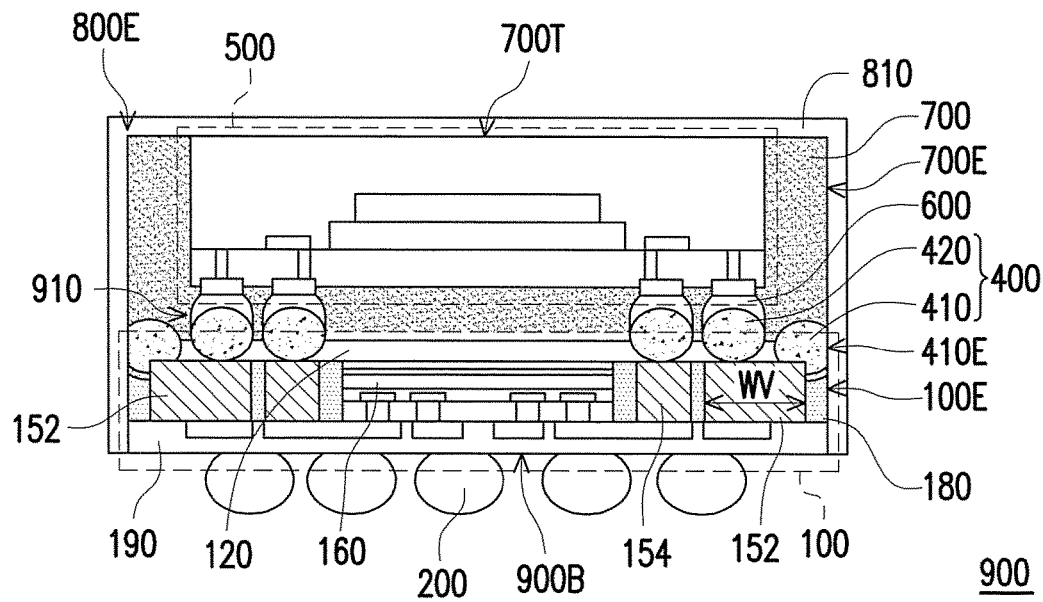
FIG. 13 schematically illustrates a packaged semiconductor device in accordance with some embodiments.

The carrier film 300 may be removed after the singulation process and subsequently, an EMI (electromagnetic interference) shielding layer 810 may be further formed on an individual POP device 800 so that a packaged semiconductor device 900 as shown in FIG. 13 is formed. The EMI shielding layer 810 is fabricated to cover the first cut edge 100E, the second cut edge 410E, the third cut edge 700E, and the top surface 700T of the sealing material 700 in a conformal manner. In some embodiments, the outer conductive bumps 410 are exposed at the second cut edge 410E and the EMI shielding layer 810 may be electrically coupled to the exposed outer conductive bumps 410. The EMI shielding layer 810 may function to inhibit, during use, electromagnetic interference. In some embodiments, the exposed outer conductive bumps 410 electrically ground the EMI shielding layer 810 through the corresponding outer via 152 connecting to the bottom conductive bump 200.

The EMI shielding layer 810 may be made of an electrically conductive material. Materials used for the EMI shielding layer 810 may include copper, nickel, an alloy of nickel and iron, an alloy of copper and nickel, silver, etc., but not limited thereto. In some embodiments, the EMI shielding layer 810 may be fabricated by using an electrolytic plating, electroless plating, sputtering, physical vapor deposition ("PVD"), chemical vapor deposition ("CVD"), atmospheric environment plasma deposition, spray coating, or other suitable metal deposition process. In some embodiments, the first cut edge 100E, the second cut edge 410E, and the third cut edge 700E form a side edge 800E which is flat without being crease by metal smear effect. The thickness of the EMI shielding layer 810 formed on the flat side edge 800E may be substantially uniformed. In other words, the EMI shielding layer may be conformed to the side edge 800E so as to provide well EMI shielding. The EMI shielding layer 810 is used for reducing or inhibiting the electromagnetic field in a space by blocking the field with barriers made of conductive or magnetic materials. The EMI shielding layer 810 in some embodiments may reduce the coupling of, for example, radio waves, electromagnetic fields and electrostatic fields.

Referring to FIG. 13, the packaged semiconductor device 900 may include a first package structure 100, a plurality of bottom conductive bumps 200, a plurality of conductive bumps 400, a second package structure 500, a plurality of conductive bumps 600, a sealing material 700 and an EMI shielding layer 810. The bottom conductive bumps 200 and the conductive bumps 400 may be disposed at two opposite surfaces of the first package structure 100. The second package structure 500 may be jointed onto the first package structure 100 through the conductive bumps 600. The conductive bumps 600 may be connected to the inner conductive bumps 420 of the conductive bumps 400 to form a plurality of inter-conductive bumps 910. In some embodiments, the sealing material 700 fill the gap between the first package structure 100 and the second package structure 500. The sealing material 700 may surround the second package structure 500, the inter-conductive bumps 910 and the outer conductive bumps 410 of the conductive bumps 400. The first package structure 100, the outer conductive bump 410 and the sealing material 700 of the packaged semiconductor device 900 may have the first cut edge 100E, the second cut edge 410E, and the third cut edge 700E and the first, second and third cut edges 100E, 410E and 700E may form a side edge 800E. The EMI shielding layer 810 covers the side edge 800E and the top surface 700T of the sealing material 700. In addition, the bottom conductive bumps 200 may be exposed without covered by the EMI shielding layer 810.

In some embodiments, the first package structure 100 may include a polymer buffer layer 120, a plurality of outer vias 152, a plurality of inner vias 154, a die 160, a molding compound 180, and a redistribution layer 190. The molding compound 180 may encapsulate the die 160, and surround the outer vias 152 and the inner vias 154. The outer vias 152 and the inner vias 154 may penetrate through the molding compound 180 for electrically connecting the conductive bumps 400 and the redistribution layer 190. In addition, the outer edge 152E of the outer conductive via 152 may be covered by the molding compound 180 without being exposed at the first cut edge 100E.

The bottom conductive bumps 200 may be disposed on the redistribution layer 190 and exposed at the bottom 900B of the packaged semiconductor device 900 for connecting to an external device. The conductive bumps 400 may include the outer conductive bumps 410 and the inner conductive bumps 420. The outer conductive bumps 410 are disposed at periphery of the first package structure 100. The inner conductive bumps 420 are connected to the conductive bumps 600 for electrically connecting between the first package structure 100 and the second package structure 500. In some embodiments, the inner conductive bumps 420 are connected to the conductive bumps 600 to form the inter-conductive bumps 910. The outer conductive bumps 410 may be connected to the outer vias 152 and have the exposed second cut edge 410E. In some embodiments, a width WV of one outer via 152 may be sufficient to be connected to one outer conductive bump 410 and one inner conductive bump 420. For example, the width WV of the outer via 152 may be 300 μm-1200 μm. In some embodiments, the width WV of the outer via 152 may be 1050 μm. The EMI shielding layer 810 may directly cover on the exposed outer conductive bumps 410 to electrically connect to the outer vias 152 and the corresponding bottom conductive bumps 200.

The second package structure 500 may be jointed onto the first package structure 100 in a flip chip manner. In some embodiments, the conductive bumps 600 may be placed on the second package structure 500 and subsequently, the conductive bumps 600 on the second package structure 500 may be jointed to the inner conductive bumps 420 on the first package structure 100 to form the inter-conductive bumps 910 connecting between the first package structure 100 and the second package structure 500. In some embodiments, the first package structure 100 may be larger than the second package structure 500 and the outer conductive bumps 410 on the first package structure 100 may not be covered and connected to the second package structure 500.

In other words, the conductive bumps 600 on the second package structure 500 may not be jointed to the outer conductive bumps 410.

The sealing material 700 may encapsulate the second package structure 500 the outer conductive bumps 410 and the inter-conductive bumps 910 for packaging the first package structure 100 and the second package structure 500 together to construct a package on package device. The EMI shielding layer 810 may cover the first cut edge 100E, the second cut edge 410E, the third cut edge 700E and the top surface 700T in a conformal manner without connecting with the bottom conductive bumps 200. The EMI shielding layer 810 may be electrically connected with the outer vias 152 through the outer conductive bumps 410 without directly contacting the outer vias 152. In other words, the EMI shielding layer 810 may be physically isolated from the outer vias 152 by the molding compound 180.

Figure 14:
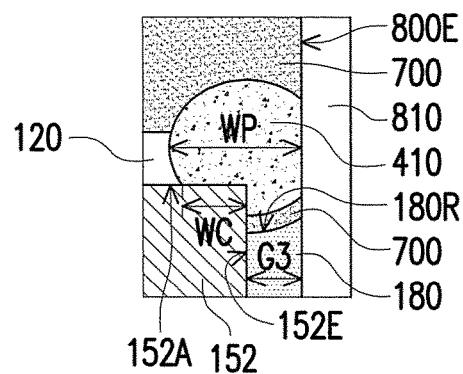
FIG. 14 schematically illustrates an enlarged view of a portion of a packaged semiconductor device in accordance with some embodiments.

Referring to FIG. 14, the outer conductive bump 410 may partially contact the outer via 152 and extend outwardly from where the outer conductive bump 410 contacts the outer via 152. The outer conductive bump 410 may have a width WP greater than the contact width WC of the outer conductive bump 410 contacting the upper surface 152A of the outer via 152. Referring to FIG. 10 and FIG. 14 together, the width WP of the outer conductive bump 410 subjected to the singulation process can be substantially equal to or smaller than the width WB of the outer conductive bump 410 before the singulation process. Furthermore, the contact width WC is smaller than both the width WP and the width WB. In some embodiments, a ratio of the width WP to the contact width WC may be more than 2 to 1. In some embodiments, the contact width WC of the outer conductive bump 410 contacting the upper surface 152A of the outer via 152 may be 5 μm-100 μm or may be 20 μm-50 μm. In addition, the molding compound 180 may surround the outer via 152 and the outer edge 152E of the outer via 152 may be spaced from the first cut edge 100E by the distance G3. In some embodiments, the outer conductive bump 410 may further cover a portion of the outer edge 152E of the outer via 152 and the outer conductive bump 410 may be firmly in contact with the outer via 152. In some embodiments, the molding compound 180 may have a recess 180R around the outer via 152 and a portion of the sealing material 700 may fill the recess. In other words, the recess 180R may be filled by the sealing material 700 and a portion of the sealing material 700 may fill the space between the outer conductive bump 410 and the molding compound 180.

In accordance with some embodiments of the present disclosure, a packaged semiconductor device includes a first package structure, at least one outer conductive bump, a second package structure, a sealing material, and an electromagnetic interference (EMI) shielding layer. The first package structure has a first cut edge. The outer conductive bump is disposed on the first package structure and has a second cut edge. The second package structure is jointed onto the first package structure. The sealing material is disposed on the first package structure, surrounds the second package structure, and covers the outer conductive bump. The sealing material has a third cut edge. The EMI shielding layer contacts the first cut edge, the second cut edge and the third cut edge. The EMI shielding layer is electrically connected with the outer conductive bump.

In accordance with alternative embodiments of the present disclosure, a packaged semiconductor device includes a first package structure, at least one outer conductive bump, a second package structure, a sealing material and an EMI shielding layer. The first package structure includes a die, a molding compound and at least one outer via. The die and the outer via are encapsulated by the molding compound, and the outer via penetrates through the molding compound. The one outer conductive bump is disposed on the first package structure and connected with the outer via. The second package structure is jointed onto the first package structure. The sealing material is disposed on the first package structure, surrounds the second package structure, and covers the outer conductive bump. The EMI shielding layer contacts the sealing material, the first package structure and the outer conductive bump. The outer conductive bump contacts the EMI shielding layer and the outer via, and the EMI shielding layer is electrically connected with the outer via through the outer conductive bump.

In accordance with alternative embodiments of the present disclosure, a method of fabricating a packaged semiconductor device includes at least the following steps. A plurality of outer conductive bumps is formed respectively on a plurality of first package structures encapsulated by a molding compound. One outer conductive bump on one first package structure is spaced from another outer conductive bump on an adjacent first package structure by a distance. A plurality of second package structures is jointed onto the first package structures and the second package structures exposing the outer conductive bumps. The second package structures are sealed on the first package structure by using a sealing material. A singulation process is performed by cutting through the sealing material, the outer conductive bumps and the molding compound to form a plurality of package on package devices and the outer conductive bumps are exposed at side edges of the package on package devices.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A packaged semiconductor device, comprising:
a first package structure having a first cut edge, wherein the first package structure comprises a die, a molding compound and at least one outer via, the die and the outer via are encapsulated by the molding compound, and the outer via penetrates the molding compound;
at least one outer conductive bump disposed on the first package structure and having a second cut edge;
a second package structure jointed onto the first package structure;
a sealing material disposed on the first package structure, surrounding the second package structure, and covering the outer conductive bump, wherein the sealing material has a third cut edge and the sealing material is in physical contact with the outer conductive bump; and
an electromagnetic interference (EMI) shielding layer disposed over the first cut edge, the second cut edge, and the third cut edge, and being in electrical contact with the outer conductive bump, wherein the EMI shielding layer is electrically connected with the outer via through the outer conductive bump.

2. The packaged semiconductor device as claimed in claim 1, wherein the first cut edge, the second cut edge and the third cut edge form a side edge and the EMI shielding layer cover the side edge in a conformal manner.

3. The packaged semiconductor device as claimed in claim 1, wherein an outer edge of the outer via is covered by the molding compound and spaced from the first cut edge by a distance.

4. The packaged semiconductor device as claimed in claim 1, wherein a width of the outer conductive bump is greater than a contact width of the outer conductive bump contacting the outer via.

5. The packaged semiconductor device as claimed in claim 1, further comprising a plurality of inter-conductive bumps connected between the first package structure and the second package structure, wherein the inter-conductive bumps are surrounded by the sealing material.

6. The packaged semiconductor device as claimed in claim 5, wherein the outer via is connected to the outer conductive bump and one of the inter-conductive bumps.

7. The packaged semiconductor device as claimed in claim 1, further comprising a plurality of bottom conductive bumps disposed on the first package structure and exposed at a bottom of the packaged semiconductor device.

8. A packaged semiconductor device, comprising:
a first package structure comprising a die, a molding compound and at least one outer via, the die and the outer via being encapsulated by the molding compound, and the outer via penetrating through the molding compound;
at least one outer conductive bump disposed on the first package structure and connected to the outer via, wherein the outer conductive bump is in contact with a top surface and an outer edge of the outer via;
a second package structure, jointed onto the first package structure;
a sealing material being disposed on the first package structure, surrounding the second package structure, and covering the outer conductive bump; and
an electromagnetic interference (EMI) shielding layer contacting the sealing material, the first package structure, and the outer conductive bump,
wherein the outer conductive bump mediates between the EMI shielding layer and the outer via and electrically connects the EMI shielding layer with the outer via.

9. The packaged semiconductor device as claimed in claim 8, wherein an outer edge of the outer via is covered by the molding compound and spaced from the EMI shielding layer by a distance.

10. The packaged semiconductor device as claimed in claim 8, wherein a width of the outer conductive bump is greater than a contact width of the outer conductive bump contacting the top surface of the outer via.

11. The packaged semiconductor device as claimed in claim 8, further comprising a plurality of bottom conductive bumps disposed on the first package structure and exposed at a bottom of the packaged semiconductor device.

12. The packaged semiconductor device as claimed in claim 8, further comprising a plurality of inter-conductive bumps connected between the first package structure and the second package structure, wherein the inter-conductive bumps are surrounded by the sealing material.

13. The packaged semiconductor device as claimed in claim 12, wherein the outer via is further connected to one of the inter-conductive bumps.

14. The packaged semiconductor device as claimed in claim 8, wherein the first package structure further comprises at least one inner via encapsulated by the molding compound and located between the outer via and the die.

15. The packaged semiconductor device as claimed in claim 14, wherein a lateral width of the outer via is greater than a lateral width of the inner via.

16. The packaged semiconductor device as claimed in claim 14, wherein the sealing material is in contact with the outer conductive bump.

17. A packaged semiconductor device, comprising:
a first package structure comprising a die, a molding compound, at least one outer via and at least one inner via, the molding compound encapsulating the die, the inner via and the outer via, and the inner via being located between the outer via and the die;
a second package structure, jointed onto the first package structure;
a plurality of inner conductive bumps disposed between the first package structure and the second package structure, wherein one of the inner conductive bumps is in contact with the outer via and another of the inner conductive bumps is in contact with the inner via;
at least one outer conductive bump disposed on the first package structure and in contact with the outer via;
a sealing material being disposed on the first package structure, surrounding the second package structure, and covering the outer conductive bump; and
an electromagnetic interference (EMI) shielding layer contacting the sealing material, the outer conductive bump, and the first package structure,
wherein the outer conductive bump mediates between the EMI shielding layer and the outer via.

18. The packaged semiconductor device as claimed in claim 17, wherein a lateral width of the outer via is greater than a lateral width of the inner via.

19. The packaged semiconductor device as claimed in claim 17, wherein a portion of the molding compound is interposed between the outer via and the EMI shielding layer.

* * * * *